United States Patent
Teraoka

(10) Patent No.: US 9,351,434 B2
(45) Date of Patent: May 24, 2016

(54) BULK FEEDER WITH FLEXIBLE PORTION

(75) Inventor: Seiichi Teraoka, Kariya (JP)

(73) Assignee: FUJI MACHINE MFG. CO., LTD., Chiryu-shi (JP)

( * ) Notice: Subject to any disclaimer, the term of this patent is extended or adjusted under 35 U.S.C. 154(b) by 0 days.

(21) Appl. No.: 14/408,689

(22) PCT Filed: Jun. 18, 2012

(86) PCT No.: PCT/JP2012/065463
§ 371 (c)(1),
(2), (4) Date: Dec. 17, 2014

(87) PCT Pub. No.: WO2013/190606
PCT Pub. Date: Dec. 27, 2013

(65) Prior Publication Data
US 2015/0181777 A1    Jun. 25, 2015

(51) Int. Cl.
*H05K 13/02* (2006.01)
*B65G 69/00* (2006.01)
*H05K 13/04* (2006.01)
*B65G 47/91* (2006.01)
*B23P 19/00* (2006.01)

(52) U.S. Cl.
CPC ............ *H05K 13/022* (2013.01); *B23P 19/006* (2013.01); *B23P 19/007* (2013.01); *B65G 69/006* (2013.01); *H05K 13/028* (2013.01); *H05K 13/043* (2013.01); *B23P 19/004* (2013.01); *B65G 47/912* (2013.01)

(58) Field of Classification Search
CPC .. B65G 47/912; B65G 69/006; B23P 19/006; B23P 19/007; B23P 19/004; H05K 13/022; H05K 13/028
See application file for complete search history.

(56) References Cited

U.S. PATENT DOCUMENTS 5,852,869 A    12/1998    Gieskes et al.

FOREIGN PATENT DOCUMENTS

| JP | 08090354 A | * 4/1996 | ............. B23P 19/00 |
| JP | H11-046088 | 2/1999 | |

(Continued)

OTHER PUBLICATIONS

Foreign Search Report mailed Dec. 3, 2015 in PCT/JP2012065463.

(Continued)

*Primary Examiner* — Gerald McClain
(74) *Attorney, Agent, or Firm* — Oblon, McClelland, Maier & Neustadt, L.L.P

(57) ABSTRACT

A bulk feeder for supplying electronic components to a supply position which is provided with a storage section for storing multiple electronic components in a loose state and a supply passage for guiding the electronic components stored in that storage section to an electronic component supply position while arranged in a single line, a section of the supply passage is a section which has flexibility and groove block member which includes an electronic component supply position is moved using the flexibility of that section with flexibility. By this, it is possible to perform correction of the supply position and it is possible to suitably align the electronic component holding position and supply position.

10 Claims, 13 Drawing Sheets

(56) References Cited

FOREIGN PATENT DOCUMENTS

| JP | 2000 22388 | | | 1/2000 | |
| JP | 2000022388 A | * | 1/2000 | ............ H05K 13/02 |
| JP | 2002-280793 | | | 9/2002 | |
| JP | 2006341350 A | * | 12/2006 | |
| JP | 2007161350 A | * | 6/2007 | |
| JP | 2012033735 A | * | 2/2012 | |
| SU | 1370810 A1 | | 1/1988 | |

OTHER PUBLICATIONS

Office Action mailed Dec. 3, 2015, in Chinese Patent Application No. 201280074037.8 (with English-language Translation).

International Search Report Issued Jul. 24, 2012 in PCT/JP12/065463 Filed Jun. 18, 2012.

* cited by examiner

BULK FEEDER WITH FLEXIBLE PORTION

TECHNICAL FIELD

The present invention relates to a bulk feeder for supplying electronic components to a supply position which indexes multiple electronic components which are stored in a loose state to a supply position while arranged in a single line.

BACKGROUND ART

Bulk feeders usually supply electronic components to a supply position, and are equipped with a storage section for storing multiple electronic components in a loose state, and a supply passage for guiding the electronic components stored in that storage section to an electronic component supply position while arranged in a single line. Bulk feeders given in the patent literature below are an example of that type of feeder, and are capable of supplying in order a relatively large quantity of electronic components.

Patent Literature 1: Japanese Unexamined Patent Application Publication Number 2000-22388

SUMMARY OF INVENTION

Problem to be Solved by the Invention

With bulk feeders with the above configuration, a relatively large quantity of electronic components can be supplied in order. On the other hand, for electronic components supplied by bulk feeders, many are relatively small, and small electronic components should be suitably held by an item such as a suction nozzles, so it is desirable that the holding position of an electronic component by an item such as a suction nozzle and the supply position of an electronic component are suitably aligned. However, recently among bulk feeders, items have been developed which are fixedly connected to a mounting head which has suction nozzles, and this type of bulk feeder is moved together with the mounting head by a moving device for moving the mounting head to any position. Due to this, with the movement of the mounting head by a moving device, the supply position and holding position of an electronic component cannot be aligned, so various methods for aligning the supply position and holding position of an electronic component are being investigated. The present invention is an item which takes account of such circumstances and relates bulk feeder which can suitably align the supply position and holding position of an electronic component.

Means for Solving the Problem

In order to solve the above problems, the bulk feeder according to claim 1 of this application comprises: a storage section for storing multiple electronic components in a loose state and a supply passage for guiding the electronic components stored in that storage section to an electronic component supply position while arranged in a single line and is a bulk feeder for supplying electronic components to the supply position; wherein the supply passage has number one block section forming a portion of the supply passage which includes the supply position, number two block section through which pass electronic components indexed from the storage section, and flexibility; and has a connecting section which connects the number one block section and the number two block section; and the bulk feeder is equipped with an actuator for moving the number one block section using the curvature of the connecting section.

Also, with the bulk feeder according to claim 2, for the bulk feeder according to claim 1, the number one block section is capable of moving in the width direction with respect to the supply position by the operation of the actuator.

Also, the bulk feeder according to claim 3, for the bulk feeder according to claim 1 or claim 2, is equipped with a control device for controlling the operation of the actuator, wherein the control device has a supply position correction section for correcting the supply position by the movement of the number one block section.

Also, the bulk feeder according to claim 4, for the bulk feeder according to claim 3, is fixedly connected to a mounting head which has a suction nozzle for picking up and holding electronic components supplied by the bulk feeder, and is capable of being moved together with the mounting head by a moving device.

Also, with the bulk feeder according to claim 5, for the bulk feeder according to claim 4, the supply position correction section corrects the supply position based on the deviation amount between the suction nozzle and electronic component obtained by taking an image of the suction nozzle with the electronic component being held thereon.

Also, with the bulk feeder according to claim 6, for the bulk feeder according to claim 4 or claim 5, the mounting head has multiple suction nozzles and the supply position correction section corrects the supply position for each of the multiple suction nozzles.

Summary of Invention

With the bulk feeder according to claim 1, a section of the supply passage is a section which has flexibility, and the curvature of that section which has flexibility is used so that number one block section which includes the supply position is movable. By this, it is possible to perform correction of the supply position and it is possible to suitably align the electronic component holding position and supply position.

Also, with the bulk feeder according to claim 2, number one block section which includes the supply position is movable in the width direction of the supply passage at the supply position. By this, it is possible to move the supply position in the width direction of the supply passage. Also, electronic components, usually, are generally rectangular, and are stored in the supply passage in an orientation in which the lengthwise direction thereof extends in the lengthwise direction of the supply passage. Due to this, by moving the supply position in the width direction of the supply passage, it is possible to adjust the width direction of the electronic component, so it is possible to suitably eliminate deviation between the electronic component holding position and supply position. Conversely, the deviation between the holding position of the electronic component by an item such as a suction nozzle and the supply position of the electronic component by the bulk feeder, as described in detail below, depends on the length in the lengthwise direction of the electronic component, and there is a certain degree of tolerance in the direction in which the supply passage extends. It follows that, for the bulk feeder according to claim 2, if the electronic component holding position and supply position are deviated, it is possible to suitably align the electronic component holding position and supply position just by adjusting the number one block section in the width direction at the supply position.

Also, with the bulk feeder according to claim 3, correction of the supply position is performed by a control device which controls the operation of an actuator. By this, it is possible to suitably align the electronic component holding position and supply position.

Also, the bulk feeder according to claim 4 is fixedly connected to a mounting head which has a suction nozzle and is capable of being moved together with the mounting head by a moving device. By this, it is not necessary to move the mounting head to the supply position, and it is possible to significantly reduce the time required to pick up and hold an electronic component by a suction nozzle.

Also, with the bulk feeder according to claim 5, correction of the supply position is performed based on the deviation amount between the suction nozzle and electronic component obtained by taking an image of the suction nozzle with the electronic component being held thereon. By this, it is possible to perform suitable correction of the supply position.

Also, with the bulk feeder according to claim 6, correction of the supply position is performed for each of the multiple suction nozzles used by the mounting head. By this, it is possible to suitably supply electronic components for all the multiple suction nozzles.

DESCRIPTION OF PREFERRED EMBODIMENTS

The following describes in detail referring to the figures, as an embodiment for carrying out the present invention, an example embodiment for the present invention.

Electronic Component Mounter Machine Configuration

Figure 1:
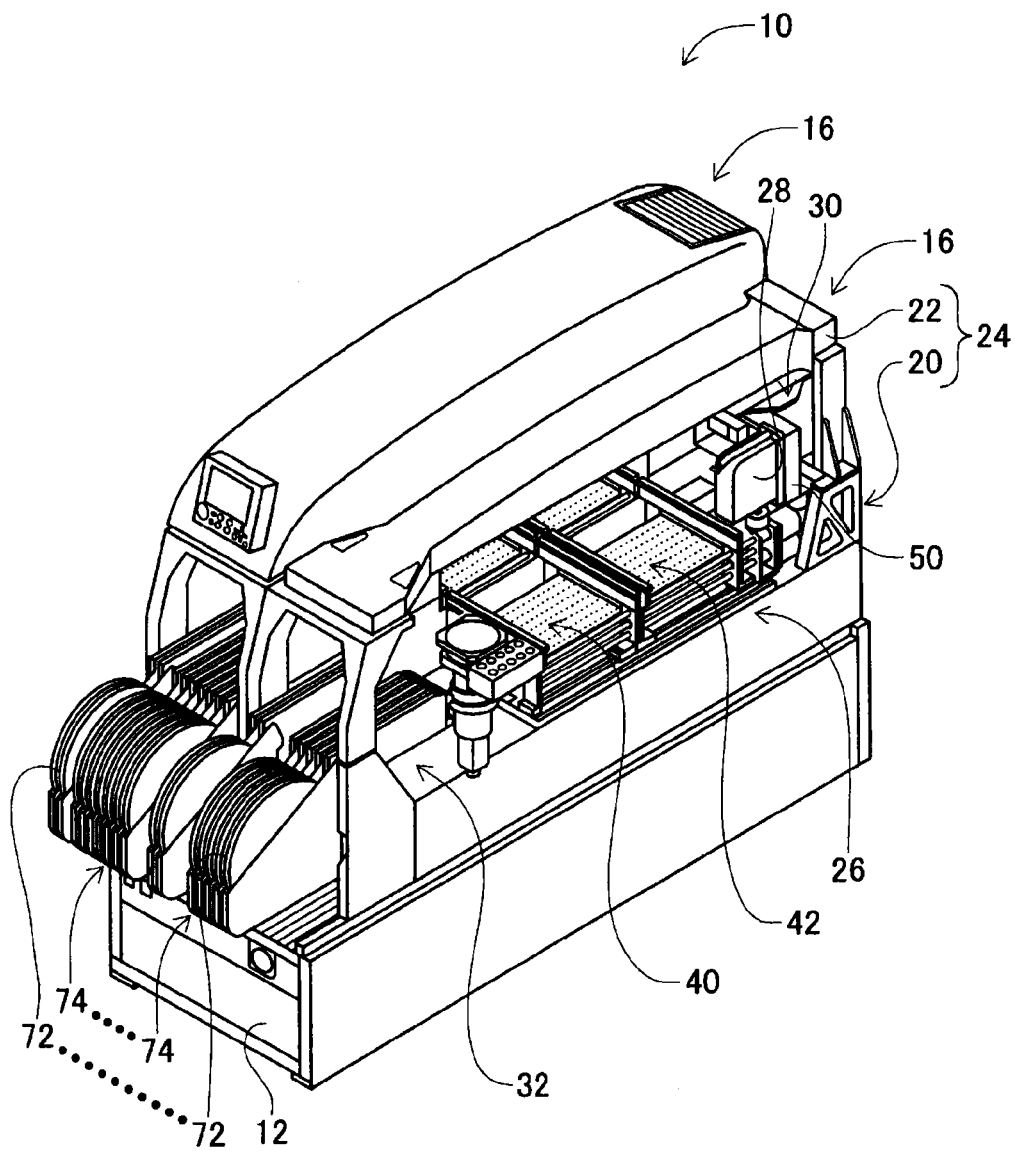
FIG. 1 This is a perspective view showing the electronic component mounter machine with bulk feeder loaded which is an embodiment of the present invention.

Electronic component mounter machine (hereafter in some cases abbreviated to "mounter machine") 10 is shown in FIG. 1. That figure is a perspective view with some sections of the external parts of mounter machine 10 omitted. Mounter machine 10 is configured including one system base 12 and two electronic component mounter modules (hereafter in some cases abbreviated to "mounter module") 16 arranged lined up side by side adjacent to each other on that system base 12, and is used to perform the mounting operation of electronic components on a circuit board. For the description below, the direction in which mounter modules 16 are lined up side by side is referred to as the X-axis direction and the horizontal direction perpendicular to that direction is the Y-axis direction.

Each mounter module 16 equipped on mounter machine 10 comprises, mainly, mounter module main body 24 configured including frame 20 and beam 22 mounted above that frame 20; conveyance device 26 for conveying circuit boards in the X-axis direction as well as securing them in a specified position; mounting head 28 for performing mounting operation on the circuit board secured by the conveyance device 26; moving device 30 for moving mounting head 28 attached to beam 22 in the X-axis direction and Y-axis direction; and electronic component supply device (hereafter in some cases abbreviated to "supply device") 32 for supplying electronic components positioned at the front of frame 20.

Conveyance device 26 comprises 2 conveyor devices 40 and 42 and those 2 conveyor devices 40 and 42 are positioned in the center of the Y-axis direction of frame 20 so that they are parallel to each other and extend in the X-axis direction. Each of the 2 conveyor devices 40 and 42 conveys circuit boards held by conveyor devices 40 and 42 in the X-axis direction using electromagnetic motor (refer to FIG. 12) 46. And, conveyed circuit boards are fixedly held at a specified position by board holding device (refer to FIG. 12) 48.

Moving device 30 is an XY robot type moving device. Moving device 30 comprises electromagnetic motor (refer to FIG. 12) 52 for sliding slider 50 in the X-axis direction and electromagnetic motor (refer to FIG. 12) 54 for sliding in the Y-axis direction. Mounting head 28 is attached to slider 50 and mounting head 28 is capable of being moved to any position on frame 20 by the operation of the two electromagnetic motors 52 and 54.

Supply device 32 is positioned on the front end of frame 20 and is a feeder type supply device. Supply device 32 has multiple tape feeders 74 which house taped components in a wound state on reels 72, and multiple indexing devices (refer to FIG. 12) 76 which index taped components which are housed in each of those multiple tape feeders 74. Taped components are electronic components which have been put into tape and supply device 32 supplies electronic components to a supply position by indexing taped components.

Figure 2:
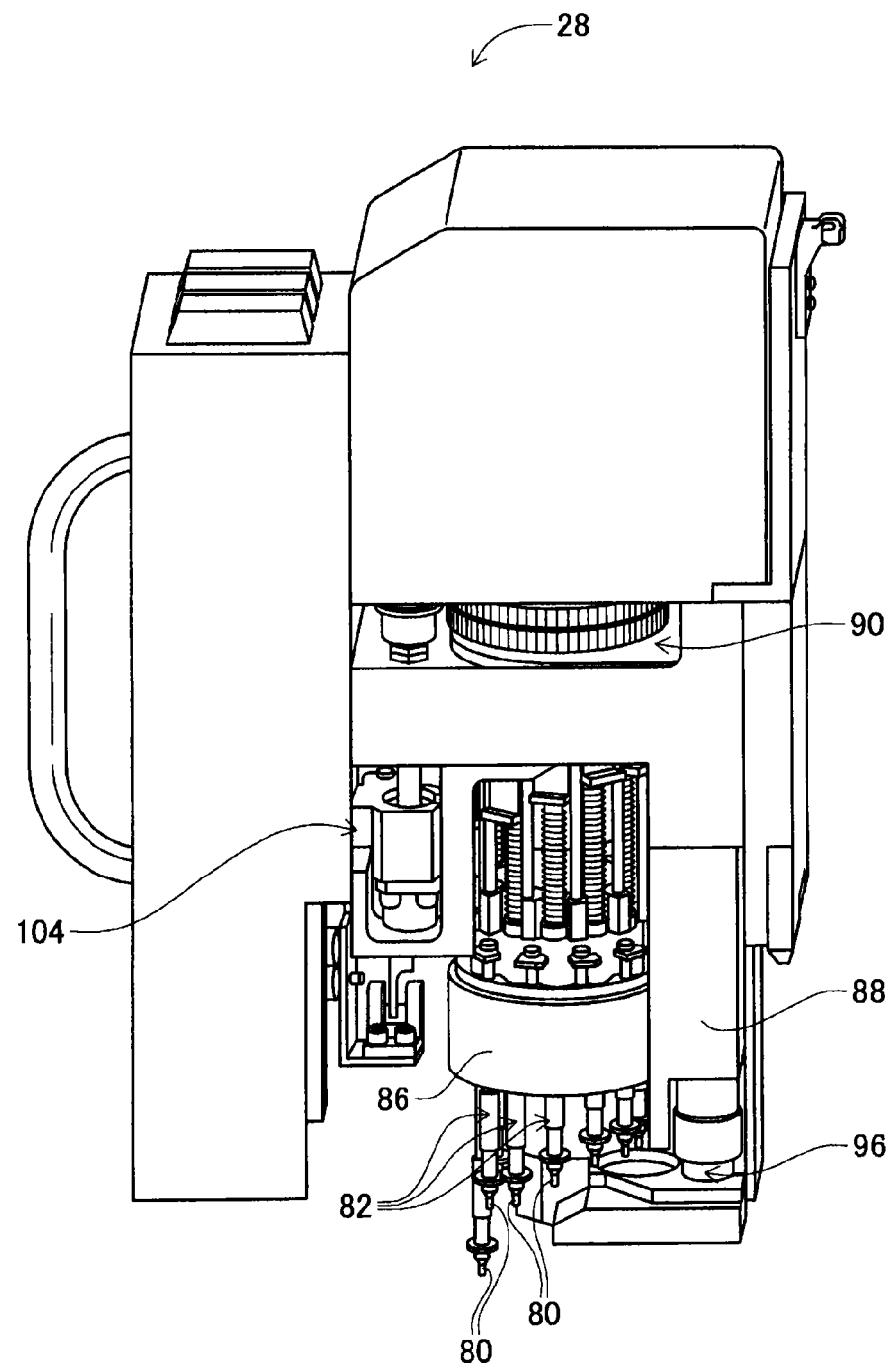
FIG. 2 This is a perspective view showing a mounting head which is provided on the electronic component mounter machine.
Figure 3:
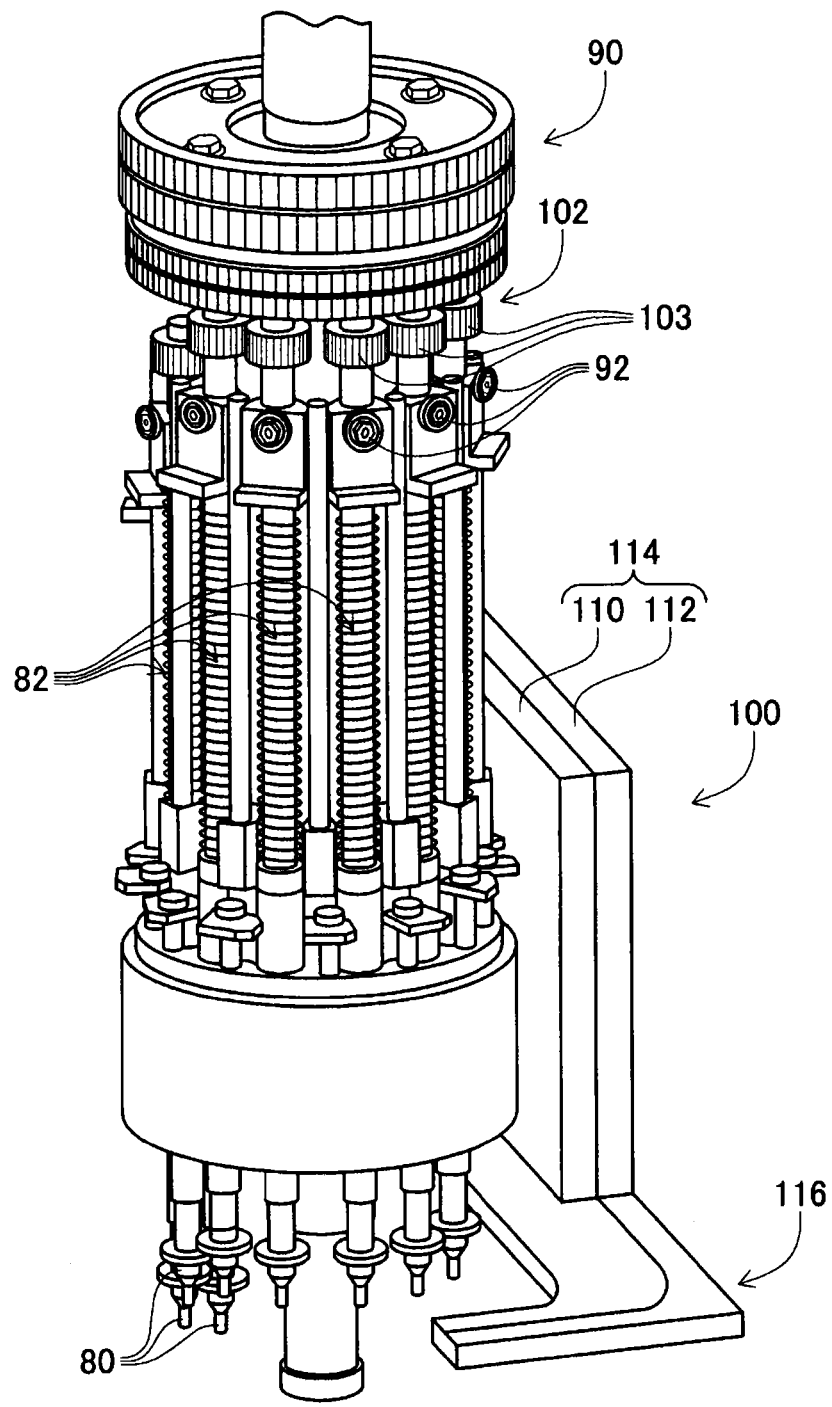
FIG. 3 This is a perspective view showing the mounting head and the bulk feeder attached to that mounting head.
Figure 4:
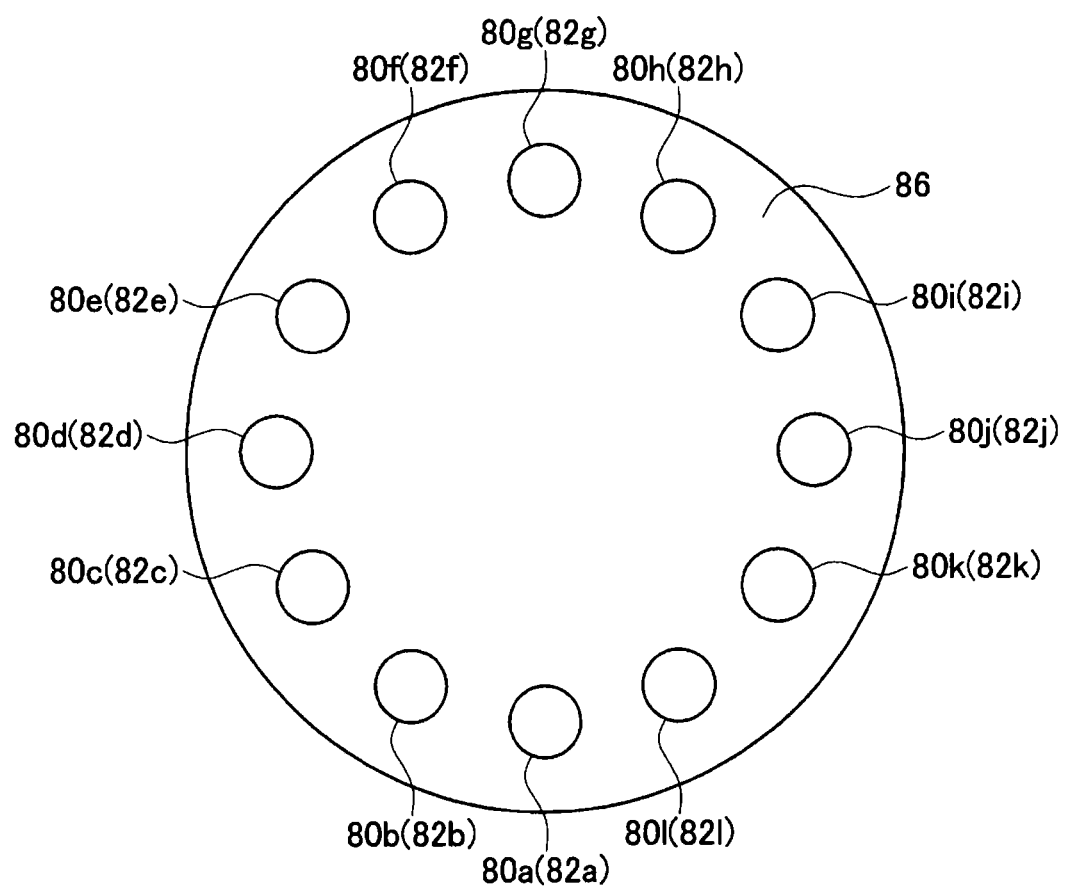
FIG. 4 This is a bottom view showing the mounting head as seen from below.

Mounting head 28 is an item for mounting electronic components to a circuit board held by conveyance device 26. Mounting head 28, as shown in FIG. 2 to FIG. 4, is equipped with twelve mounting units 82 and each of those twelve mounting units 82 holds a suction nozzle 80 for picking up electronic components at the tip section. Also, FIG. 2 is a perspective view showing mounting head 28 in a state removed from slider 50, and FIG. 3 is a perspective view showing mounting head 28 in a state with the covers removed. Also, FIG. 4, is a bottom view of mounting head 28 showing mounting head 28 as seen from below.

Each suction nozzle 80 are connected to a positive/negative pressure supply device (refer to FIG. 12) via a negative air and positive air supply passage. And, each suction nozzle 80 picks up and holds an electronic component using negative pressure, and releases a held electronic component by supplying a small amount of positive pressure. Also, mounting units 82 which generally take the form of shafts are held in a state so that the axis direction is vertical at a pitch of equal angles on the outer circumference section of unit holding body 86. Those suction nozzles 80 which are held at the tip section of mounting units 82, as shown in FIG. 4, extend facing downwards from the lower surface of unit holding body 86 at 12 evenly distributed positions. By this, the twelve suction nozzles 80 are arranged on a circumference.

Unit holding body 86 is supported by head body 88 of mounting head 28 so that it is capable of being rotated about a vertical axis line of itself, and is capable of being rotated to any angle by holding body rotating device 90. By this, multiple suction nozzles 80 arranged on a circumference are capable of being rotated to any angle with the center of the circumference as the axis center.

Rollers 92 which function as a cam follower are equipped at the top section of each mounting unit 82. Each roller 92 is engaged with the cam surface of the cam (omitted from figure) fixed to head body 88, and the height of the cam surface changes in the circumferential direction. Also, each mounting unit 82 is held on unit holding body 86 so that it is capable of moving up and down. By this, mounting units 82 move up and down based on the rotation of unit holding body 86.

In detail, mounting unit 82 located at the mounting station (the station located furthest to the front) which is the stopping position furthest from head body 88 among the multiple stopping positions of mounting units 82 moves furthest down. In other words, when mounting head 28 is moved above a circuit board, the distance between suction nozzle 80 of mounting unit 82 located at that station and the circuit board is at its shortest, and an electronic component is mounted on the circuit board by suction nozzle 80 of that mounting station.

Also, the station positioned directly opposite across the axis center of unit holding body 86 of that mounting station, in other words, the mounting unit 82 located at the imaging station (the station located furthest to the rear) which is the stopping position closest to head body 88, and the four mounting units 82 which are located two each on either side to the left and right of that mounting unit 82, move furthest up. In other words, five mounting units 82 centered around mounting unit 82 located at the imaging station move furthest up.

Head body 88, as shown in FIG. 2, extends lower than the bottom tip of suction nozzle 80 of each mounting unit 82 which is located furthest up and bends to the suction nozzle 80 side. Parts camera 96 is arranged on that portion which is bent, and an image is captured by parts camera 96 of the electronic component being held on suction nozzle 80 of mounting unit 82 located at the imaging station. Also, mark camera (refer to FIG. 12) 98 is arranged in a state facing down on the lower surface of the bent portion of head body 88. And, by moving head body 88 with moving device 30, it is possible to capture an image with the mark camera at any position on frame 20.

Here, the positional relationship of each station is described using FIG. 4. When mounting unit 82*a* which is one out of the twelve mounting units 82*a* to 82*l* is located at the mounting station, in other words when mounting unit 82*a* is moved furthest down, five mounting units 82*e* to 82*i* are moved furthest up and mounting unit 82*g* is located at the imaging station. Further, when unit holding body 86 rotates in the normal direction, unit holding body 86 rotates in the clockwise direction in FIG. 4.

Also, the station at which mounting unit 82*e* which of the five mounting units 82*e* to 82*i* is furthest downstream in the rotation direction of unit holding body 86 is located, is the pickup station for picking up electronic components supplied from bulk feeder (refer to FIG. 3) 100 which is described in detail later. Further, electronic components supplied from tape feeders 74 are picked up by suction nozzle 80*a* of mounting unit 82*a* located at the mounting station.

Also, mounting head 28 has unit rotating devices 102 for rotating each mounting unit 82 about its own center axis respectively at the same time. As shown in FIG. 3, unit rotating device 102 is configured from multiple gears 103 provided at the top end of multiple mounting units 82 and one gear (omitted from the figure) which engages with those multiple gears 103, and by those multiple gears 103 rotating due to the rotation of the one gear, each mounting unit 82 rotates around its own axis at the same time. By this, it is possible to change the holding orientation of electronic components being held by each mounting unit 82. Also, mounting head 28 is provided with unit raising and lowering device 104 for raising and lowering individually mounting units 82 which are located at the mounting station and pickup station, and mounting units 82 are moved to any position in the vertical direction when electronic components are mounted and picked up.

Figure 5:
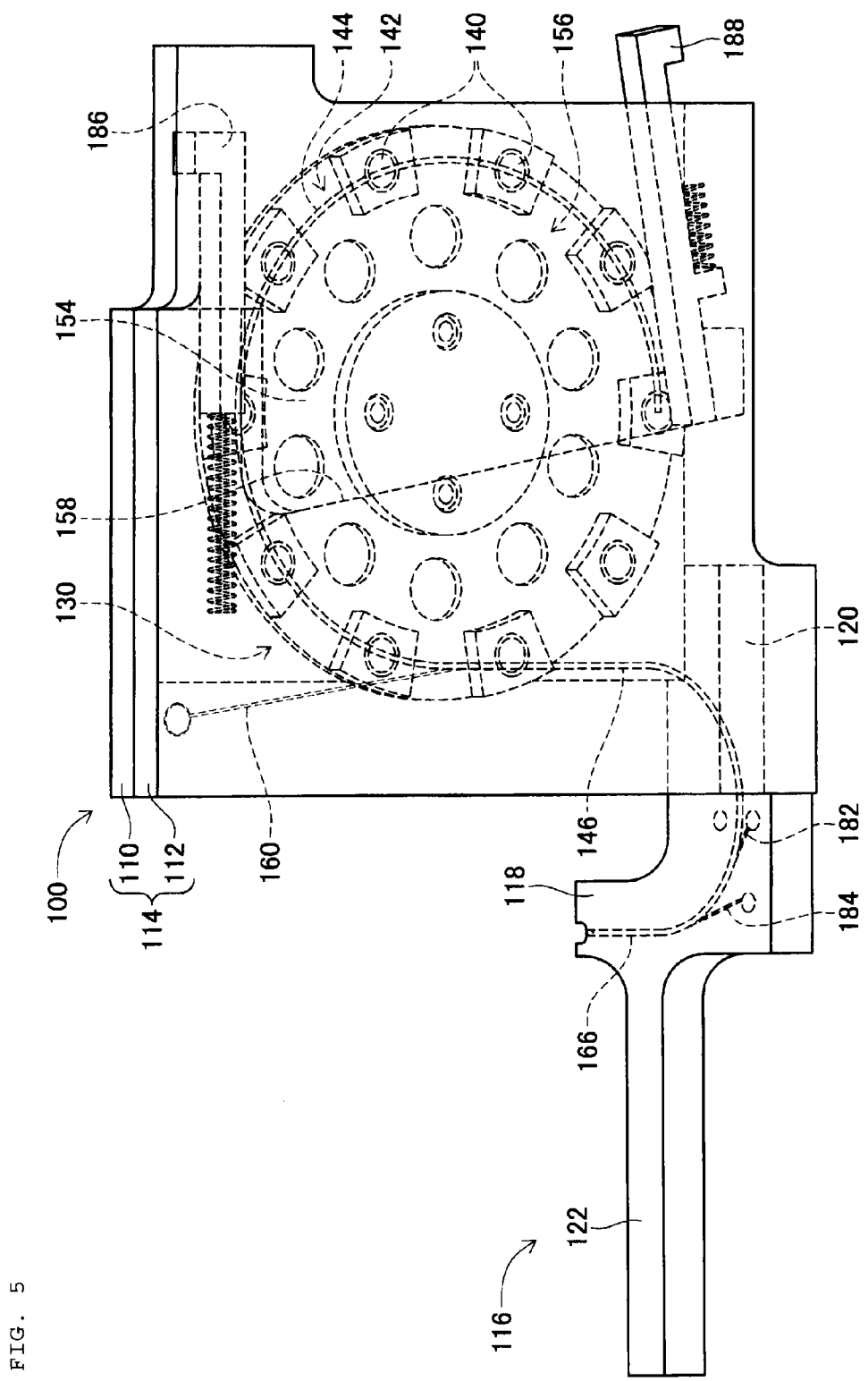
FIG. 5 This is a perspective view showing the bulk feeder.
Figure 6:
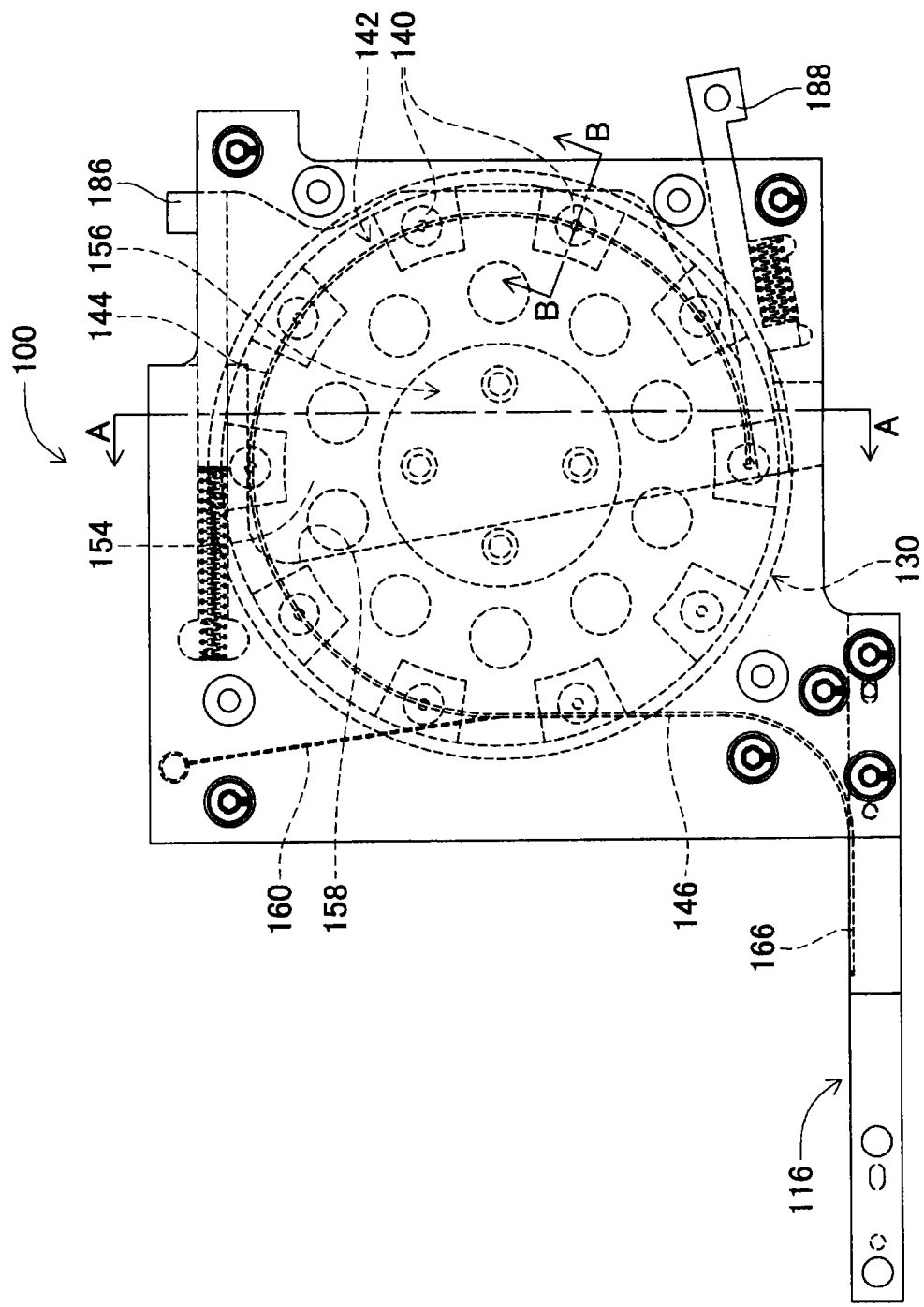
FIG. 6 This is a side view showing the bulk feeder.

Also, bulk feeder 100 which supplies electronic components to mounting unit 82 positioned at the pickup station is attached to head body 88 of mounting head 28. Due to this, bulk feeder 100 is capable of being moved to any position on frame 20 along with mounting head 28 by moving device 30. As shown in FIG. 5 and FIG. 6, bulk feeder 100 has housing 114 which is two case members 110 and 112 fitted reciprocally together, and arm member 116 fastened by bolts to head body 88 and secured to the bottom end of housing 114.

Arm member 116 is divided into number one arm section 118 which reaches lower than mounting unit 82 located at the pickup station, number 2 arm section 120 which is orthogonal while being in the same horizontal plane as number 1 arm section 118, and number 3 arm section 122 which is orthogonal while being in the same horizontal plane as number 1 arm section 118 and which extends in the opposite direction to number 2 arm section 120. Arm member 116 is fastened by bolts to head body 88 at number 3 arm section 122, and is fastened by bolts to housing 114 at number 2 arm section 120.

Figure 7:
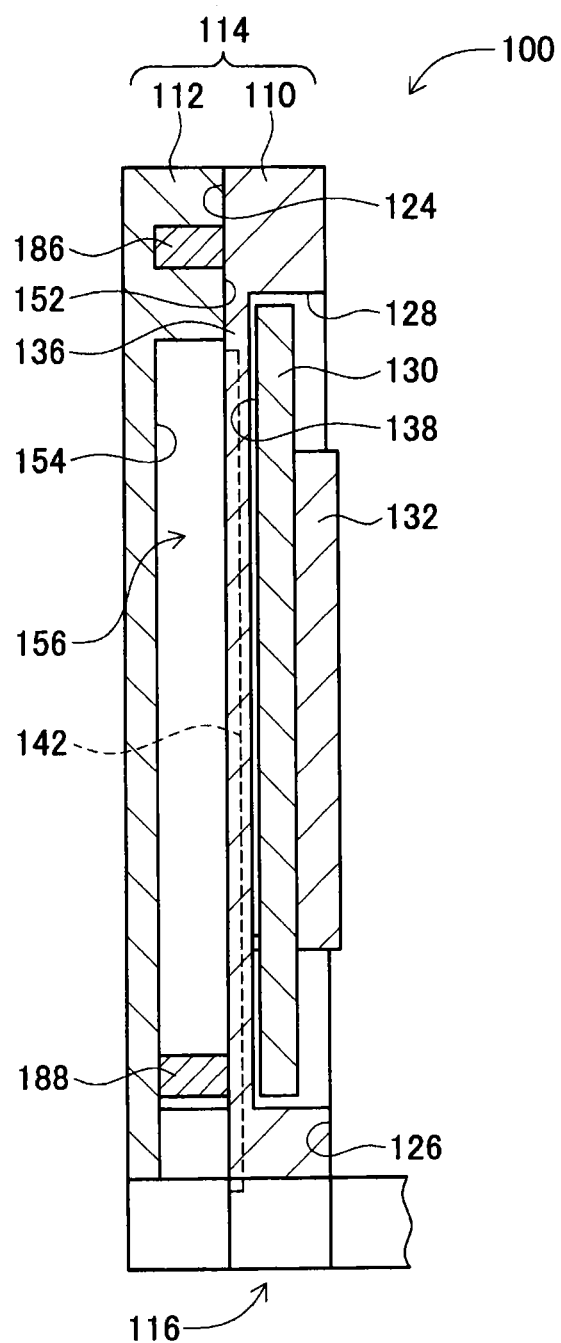
FIG. 7 This is a cross section of line AA shown in FIG. 6.

The two case members 110 and 112 which make up housing 114 are tabular plates and are established in a state with their respective surfaces fitted together. As shown in FIG. 7 which is a cross section along the line AA of FIG. 6, fitting surface 124 to which case member 112 is fitted and recess section 128 which opens in surface 126 on the opposite side are formed on case member 110, and turntable 130 is provided inside that recess section 128.

Turntable 130 is disc shaped and is held on case member 110 such that it is capable of being rotated around its center axis. Rotation movement device 132 is provided on turntable 130 and turntable 130 is controllably rotated by the movement of electromagnetic motor (refer to FIG. 12) 134 of rotation movement device 132. Further, when turntable 130 is rotated in the normal direction, turntable 130 shown in FIG. 6 rotates in the counterclockwise direction.

Figure 8:
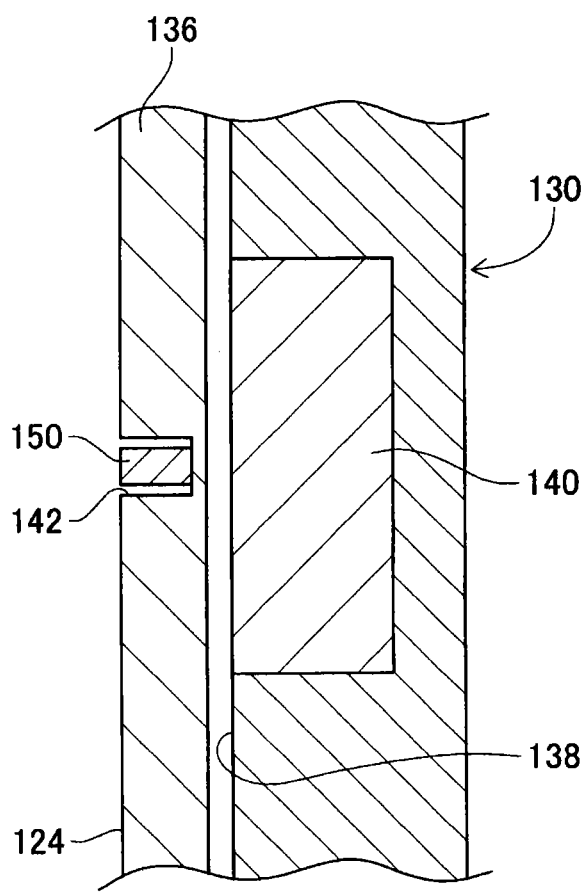
FIG. 8 This is a cross section of line BB shown in FIG. 6.

As shown in FIG. 8 which is a cross section along line BB of FIG. 6, permanent magnet 140 is embedded in the opposite surface 138 of turntable 130 facing base section 136 of recess section 128 formed in case member 110. As shown in FIG. 6, ten permanent magnets 140 are embedded near the outer edge section of turntable 130, and the ten permanent magnets 140 are positioned evenly.

Also, on base section 136 of recess section 128, groove 142 is formed in fitting surface 124 which is the surface on the opposite side of the surface facing turntable 130. As shown in FIG. 6, groove 142 is divided into annular groove section 144 which is a portion that is annular with the rotational axis line of turntable 130 as its center and vertical groove section 146 which is connected to that annular groove section 144 and extends generally in the vertical direction.

Annular groove section 144 is formed in the position following the rotation path of the ten permanent magnets 140 based on the rotation of turntable 130, and extends in the rotation direction of the normal rotation of turntable 130 from the lowest point of the rotation path of permanent magnets 140, via the highest point of the rotation path of permanent magnets 140, and arrives at the foremost end (the end point on the side of arm member 116). On the other hand, vertical groove section 146 connects on from the foremost end extending down of annular groove section 144 and extends down. And, it is curved to the front (in the direction towards arm member 116), and open to the side surface of the front of case member 110 in a state which is generally horizontal.

Inside groove 142, as well as electronic components being housed while the longitudinal direction thereof extends in the longitudinal direction of groove 142, multiple electronic components are housed in a state arranged in a single line in the longitudinal direction of each thereof. As shown in FIG. 8, the depth of groove 142 is slightly larger than the height of electronic component 150, and the width of groove 142 is slightly larger than the width of electronic component 150. And, electronic components 150 are housed in groove 142 so that the width direction is in the width direction of groove 142.

Also, on case member 112, as shown in FIG. 7, recess section 154 which opens and is formed in fitting surface 152 which is fitted to fitting surface 124 in which groove 142 is formed. In detail, recess section 154, as shown in FIG. 6, is generally semicircular and is formed in a state extending backwards from a section of the rotational axis line of turntable 130 and annular groove section 144, specifically, the lowest point of annular groove section 144, and covering the portion reaching the highest point. And, two case members 110 and 112 are fitted together by respective fitting surfaces 124 and 152, and the opening of recess section 154 is blocked by base section 136. In other words, storage section 156 is bounded by recess section 154 of case member 112 and base section 136 of case member 110.

The portion covered by recess section 154 of annular groove section 144 is open to the inside of recess section 154, in other words, storage section 156. Also, annular groove section 144, as given above, is formed along the rotation path of permanent magnets 140. Due to this, electronic components housed in storage section 156 are housed in annular groove section 144 by the magnetic force of permanent magnets 140. Further, by rotating turntable 130 in the normal direction via the movement of rotation movement device 132, electronic components housed in annular groove section 144 are moved in the rotational direction of turntable 130.

However, the portion not covered by recess section 154 of annular groove section 144 is blocked by fitting surface 152 of case member 112. In other words, the portion not covered by recess section 154 of annular groove section 144 is a tunnel with a rectangular cross section shape. Due to this, when electronic components housed in annular groove section 144 reach the tunnel shaped annular groove section 144 in accordance with the rotation of turntable 130, electronic components which protrude from annular groove section 144 are prevented from entering into tunnel shaped annular groove section 144 by side wall 158 of recess section 154.

Specifically, side wall 158 which is located at the diameter section of semicircular recess section 154 is established perpendicular with respect to fitting surface 124 formed in groove 142, and the upper end section of side wall 158 is located near the highest point of annular groove section 144. And, annular groove section 144 located upstream of side wall 158 opens onto storage section 156, and annular groove section 144 located downstream of side wall 158 is tunnel shaped. Due to this, electronic components protruding from annular groove section 144 contact side wall 158 near the highest point of annular groove section 144 and are prevented from being indexed from storage section 156. By this, only electronic components which are appropriately housed in annular groove section 144 are indexed from storage section 156. Further, case member 112 is formed out of semi-transparent material so that items such as storage section 156 and annular groove section 144 can be checked visually from outside.

Also, air groove 160 for supplying air is formed in fitting surface 124 which is formed in groove 142 formed from annular groove section 144 and vertical groove section 146. This air groove 160 is formed to extend in the vertical direction, and the lowest section thereof is connected to the boundary portion of annular groove section 144 and vertical groove section 146. Air groove 160, at the uppermost section, is linked to an air passage (omitted from figure) which is connected to an air supply device (omitted from figure), so that compressed air can be blown downwards inside air groove 160. Also, the air passage is provided with an opening and closing valve (omitted from figure), and the supply and blocking of air can be controlled by controlling solenoid (refer to FIG. 12) 164 of the opening and closing valve.

Figure 9:
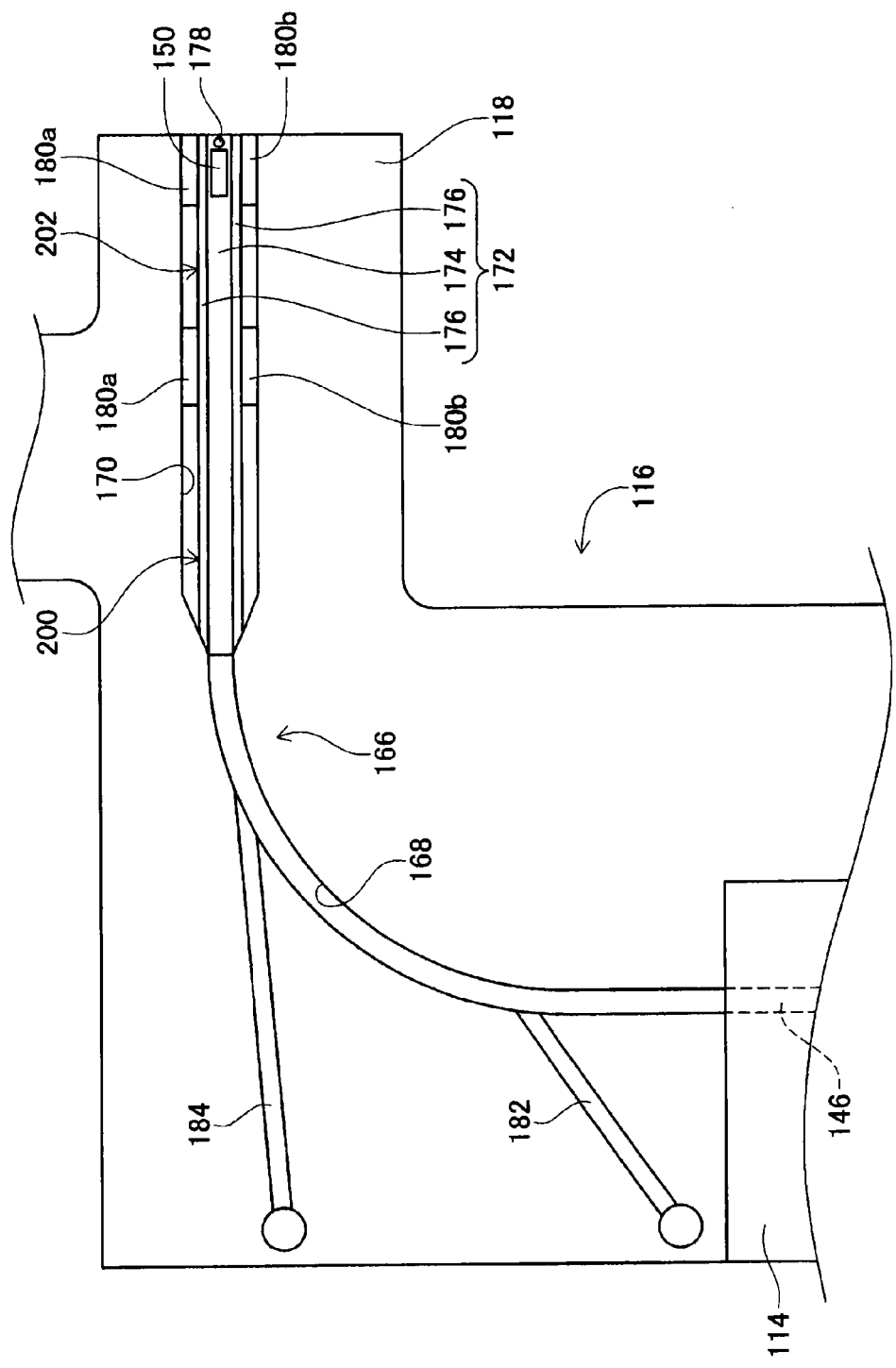
FIG. 9 This is an enlarged drawing showing an electronic component supply passage which includes a supply position.

Also, on arm member 116, as shown in FIG. 5, as well as opening on the upper surface, groove 166 connected to vertical groove section 146 open the side surface of the front of case member 110 is formed. Groove 166 is bent towards number 1 arm section 118 and extends to the end surface of number 1 arm section 118. Groove 166, as shown in FIG. 9, is divided into curved section 168 which curves towards number one arm section 118 and which connects on from vertical groove section 146, and straight section 170 at the tip section of number one arm section 118 which connects on from curved section 168. The width of curved section 168 is slightly larger than the width of electronic component 150 and electronic components indexed from vertical groove section 146 pass through curved section 168. On the other hand, the width of straight section 170 is wider than the width of curved section 168, and groove block member 172 which has a U-shaped cross section is provided inside straight section 170.

Groove block member 172 is formed from a resin material which is flexible and is configured from base section 174 and a pair of side wall sections 176 established either side of the base section 174. The height of and distance between that pair of side wall sections 176, in other words the depth and width of groove block member 172, is the same as the depth and width of curved section 168, and the starting end of groove block member 172 is connected to the tip section of curved section 168. By this, electronic components 150 which have passed through curved section 168 are indexed inside groove block member 172. And, the tip section of groove block member 172 is at the tip section of number 1 arm section 118, and pin 178 is established in base section 174 of the tip section of that groove block member 172. Due to this, electronic components 150 indexed inside groove block member 172 are stopped by pin 178. The stopping location by that pin 178 is the supply position (the position shown by electronic component 150 in FIG. 9) of electronic components 150 by bulk feeder 100.

Also, clearance is provided between groove block member 172 and straight section 170 in which groove block member 172 is arranged, and four piezoelectric elements 180 are interposed in that clearance. In detail, in between one of the pair of side walls 176 of groove block member 172 (the side wall positioned in the upper side in FIG. 9) and the side wall of straight section 170 facing that side wall 176, two piezoelectric elements 180a are interposed at the tip section and center section of groove block member 172. And, in between the other of the pair of side walls 176 (the side wall positioned in the lower side in FIG. 9) and the side wall of straight section 170 facing that other side wall 176, two piezoelectric elements 180b are interposed at the tip section and center section of groove block member 172. Here, piezoelectric elements 180, by changing the shape of the piezoelectric body (omitted from the figure) of which they are formed via the passage of electric current, are actuators the thickness of which is changed. By this, piezoelectric elements 180, as described in detail below, are capable of changing the shape of groove block member 172 which is flexible.

Also, two air grooves 182 and 184 are formed on arm member 116 which, as well as opening onto the upper surface, are connected to curved section 168 of groove 166. The above air passages are also connected to these air grooves 182 and 184 and compressed air is blown towards the end surface of number one arm section 118 inside groove 166. Here, air groove 182 is connected to the end section at the upstream side of curved section 168, and air groove 184 is connected to the end section at the downstream side of curved section 168. By this, electronic components indexed inside groove 166 do not become congested inside curved section 168.

Here, the upper surface of arm member 116 is covered by a cover (omitted from figure), and groove 166 and air grooves 182 and 184 are tunnel shaped. Also, a cutout section (omitted from figure) is formed in the position covering the supply position for electronic components of number 1 arm section 118, and supply of electronic components is performed via that cutout section. Further, the cover is formed from semi-transparent material so that groove 166 and air grooves 182 and 184 can be checked visually from outside.

Also, storage section 156 for storing electronic components, in other words, recess section 154 formed in case member 112, is open to the upper surface and lower surface of case member 112, and shutters 186 and 188 are provided on those openings respectively. Each shutter 186 and 188 can be opened and closed by being slid. By this, by opening shutter 186 it is possible to replenish electronic components inside storage section 156, and by opening shutter 188 it is possible to evacuate electronic components stored in storage section 156 outside of bulk feeder 100.

With bulk feeder 100 configured as given above, electronic components are stored inside storage section 156 in a loose state, and those multiple electronic components stored in a loose state are indexed to a supply position while arranged in a single line. Specifically, electronic components housed in storage section 156 are taken into annular groove section 144 by the magnetic force of permanent magnets 140. Further, by rotating turntable 130 in the normal direction via the movement of rotation movement device 132, electronic components taken into annular groove section 144 are moved in the rotational direction of turntable 130. During this, multiple electronic components come to be arranged in a single line inside annular groove section 144.

When electronic components housed in annular groove section 144 reach the tunnel shaped annular groove section 144 in accordance with the rotation of turntable 130, electronic components which protrude from annular groove section 144 contact side wall 158 of recess section 154. By this, electronic components which contact side wall 158 drop to the bottom of storage section 156. And, only electronic components which are appropriately housed in annular groove section 144 are moved inside annular groove section 144 in accordance with the rotation of turntable 130.

In accordance with the rotation of turntable 130, electronic components are moved from inside annular groove section 144 to inside vertical groove section 146. And, although electronic components move down by their own weight inside vertical groove section 146, they are indexed to curved section 168 of groove 166 through the inside of vertical groove section 146 by air which is blown inside vertical groove section 146 from air groove 160. Electronic component indexed to curved section 168 are further indexed towards groove block member 172 by air which is blown inside curved section 168 from air grooves 182 and 184. Then, electronic components contact pin 178 established inside groove block member 172. By this, with bulk feeder 100, multiple electronic components housed in a loose state are indexed to the supply position while arranged in a single line.

Figure 10:
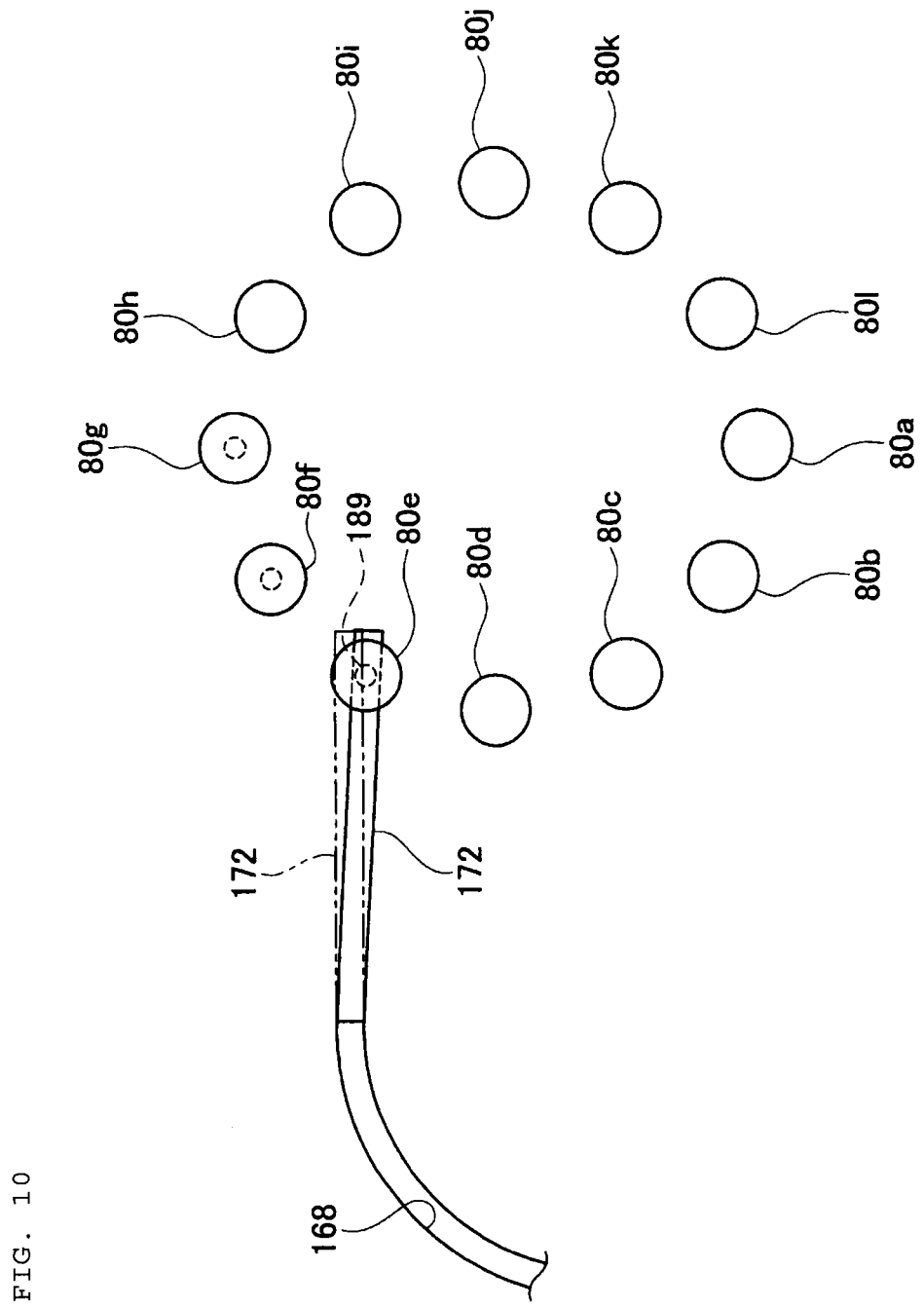
FIG. 10 This is a schematic drawing showing the positional relationship between a supply position by a bulk feeder and a pickup position by a suction nozzle.
Figure 11:
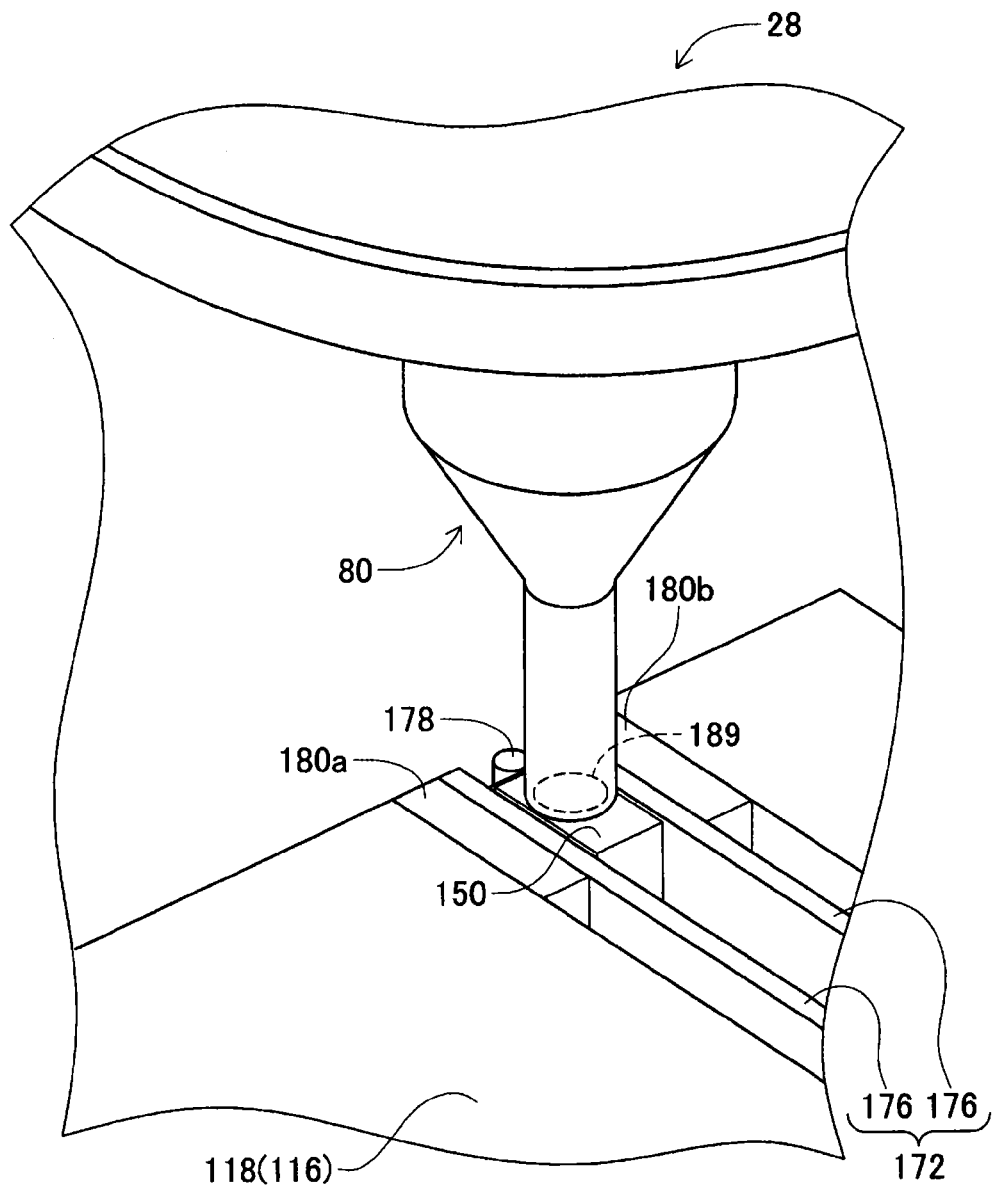
FIG. 11 This is a perspective view showing a suction nozzle while picking up an electronic component which has been indexed to the supply position.

Also, bulk feeder 100 is fixed to mounting head 28 and, as shown in FIG. 10, suction mouth 189 of suction nozzle 80e out of the multiple suction nozzles 80 positioned at the pickup position is positioned above the tip section of groove block member 172 which is the supply position of the electronic component. By this, by suction nozzle 80e positioned at the pickup station being moved down by unit raising/lowering device 104, as shown in FIG. 11, electronic component 150 indexed to the supply position is picked up and held by suction mouth 189 of suction nozzle 80.

Figure 12:
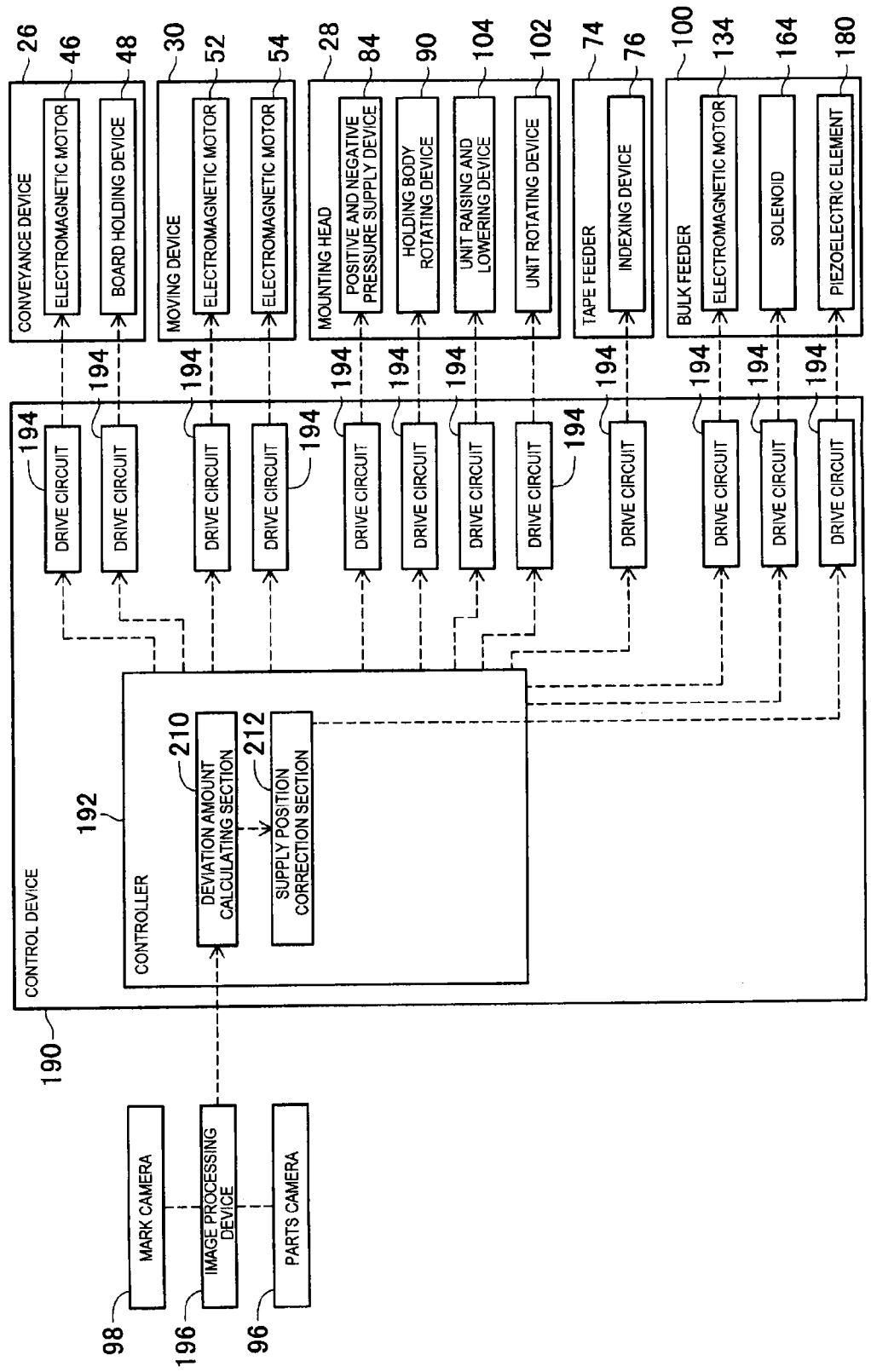
FIG. 12 This is a block diagram showing the control device which is provided on the electronic component mounter machine.

Also, mounter module 16, as shown in FIG. 12, is equipped with control device 190. Control device 190 is equipped with controller 192 which is comprised mainly of a computer equipped with items such as CPU, ROM, and RAM; and multiple drive circuits 194 corresponding respectively to the above electromagnetic motors 46, 52, 54, and 134; board holding device 48; indexing device 76; positive and negative pressure supply device 84; holding body rotating device 90; unit rotating device 102; unit raising and lowering device 104; solenoid 164; and piezoelectric elements 180. Also, the driving power for items such as the conveyance device and moving device are connected to controller 192 via each drive circuit 194, such that operation of items such as the conveyance device and moving device can be controlled. Also, image processing device 196 for processing data of images acquired by parts camera 96 and mark camera 98 is connected to controller 192, so that various types of data can be acquired from the image data.

Mounting Work by the Electronic Component Mounter

With mounter 16, according to the configuration outlined above, it is possible to perform the mounting work of mounting electronic components onto a circuit board. To describe in detail, first, a circuit board is conveyed to the mounting work position by conveyor devices 40 and 42 and then the circuit board is held fixedly in that position. Next, mounting head 28 is moved above the circuit board by moving device 30, and an image of the circuit board is captured by mark camera 98. From that image the type of the circuit board and the holding position error of the circuit board due to conveyor devices 40 and 42 is acquired. Tape feeder 74 or bulk feeder 100 supplies electronic components for that type of circuit board which was acquired. Further, those supplied electronic components are picked up and held by suction nozzles 80 of mounting head 28 at the mounting station or pickup station. However, in order to pick up and hold electronic components supplied by a tape feeder 74, it is necessary to move mounting head 28 to the supply position of tape feeders 74 by moving device 30. Continuing, images of electronic components picked up and held by suction nozzles 80 are captured by parts camera 96 at the imaging station. From that image the holding position error of the electronic components is acquired. And, mounting head 28 is moved above the mounting position on the circuit board by moving device 30. At that position, suction nozzle 80, after being rotated based on the difference between the circuit board and the electronic component holding position, is lowered. By this, the electronic component being held by suction nozzle 80 is mounted on the circuit board.

Correction of the Supply Position by the Bulk Feeder

As given above, mounter 16 picks up and holds electronic components supplied by tape feeders 74 or bulk feeder 100 using suction nozzles 80, and mounts those picked up and held electronic components on a circuit board. Due to this, with mounter 16, it is very important that electronic components are picked up by suction nozzles 80 appropriately, so it is desirable to align the supply position of the electronic component and the pickup position by suction nozzle 80.

To this end, in cases in which the pickup position by suction nozzle 80 and the supply position of the electronic component from tape feeder 74 deviate, the position of mounting head 28 is finely adjusted by moving device 30. By this, the pickup position by suction nozzle 80 from tape feeder 74 is corrected, and it is possible to align the supply position of the electronic component by tape feeder 74 and the pickup position by suction nozzle 80.

On the other hand, bulk feeder 100 is fixed to mounting head 28, and so it moved together with mounting head 28 by moving device 30. Due to this, in cases in which the pickup position by suction nozzle 80 and the supply position of the electronic component by bulk feeder 100 deviate, even if mounting head 28 is moved by moving device 30, it is not possible to align the pickup position by suction nozzle 80 and the supply position of the electronic component from bulk feeder 100. Due to this, with bulk feeder 100, by changing the shape of groove block member 172 which is flexible, the supply position of electronic components from bulk feeder 100 is corrected.

In detail, with bulk feeder 100, as given above, it is possible to change the shape of groove block member 172 by passing current through piezoelectric elements 180. Due to this, by controlling the amount of current passed through piezoelectric elements 180, the shape of groove block member 172 can be freely changed. Specifically, as shown in FIG. 10, in cases in which the pickup position by suction nozzle 80e and the supply position at the top section of groove block member 172 (2-dash line) deviate, the amount of current passing through each piezoelectric element 180 is controlled such that the thickness of the two piezoelectric elements 180a (refer to FIG. 9) increases and the thickness of the two piezoelectric elements 180b (refer to FIG. 9) decreases.

By this, the starting section of groove block member 172 bends and the tip section of groove block member 172 deviates in the widthwise direction of groove block member 172. In detail, the section of the starting end side of groove block member 172, in the other words, the section 200 not sandwiched by piezoelectric elements 180 (hereafter referred to as the "flexible section") (refer to FIG. 9) bends, and the section at the tip section side of groove block member 172, in other words, the section 202 (hereafter also referred to as "moving section") (refer to FIG. 9) moves in the widthwise direction of groove block member 172. Due to this, the section at the tip section side of groove block member 172, in other words, the supply position of the electronic components, is adjusted in the widthwise direction of groove block member 172, and it is possible to suitably pick up an electronic component by suction nozzle 80.

Figure 13:
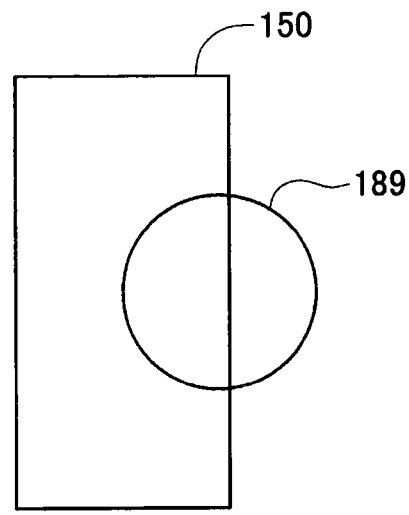
FIG. 13 This is a schematic drawing showing when the suction nozzle and electronic component are deviated in the widthwise direction of the electronic component.

For this, because electronic components are stored in an orientation such that the lengthwise direction thereof extends in the lengthwise direction of groove block member 172, by adjusting the supply position in the widthwise direction of the electronic component, the deviation between suction mouth 189 of suction nozzle 80 and the electronic component can be suitably resolved. Specifically, as shown in FIG. 13, in cases in which electronic components at the supply position are deviated in the widthwise direction of electronic component 150 with respect to the suction mouth 189 of suction nozzle 80 positioned at the pickup station, even if the deviation is small, only a portion of suction mouth 189 is blocked by electronic component 150 and there is a risk that electronic component 150 cannot be picked up appropriately. Due to this, by adjusting the supply position in the widthwise direction of electronic component 150 by the movement in the widthwise direction of moving section 202 of groove block member 172, it is possible to suitably pick up electronic component 150 by suction nozzle 80.

Figure 14:
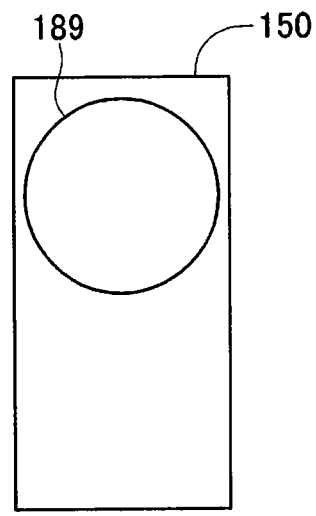
FIG. 14 This is a schematic drawing showing when the suction nozzle and electronic component are deviated in the lengthwise direction of the electronic component.

On the other hand, as shown in FIG. 14, even if electronic component 150 at the supply position is somewhat deviated in the lengthwise direction of electronic component 150 with respect to suction mouth 189 of suction nozzle 80 positioned at the pickup station, suction mouth 189 is completely blocked by electronic component 150 depending on the length in the lengthwise direction of electronic component 150. In other words, there is somewhat of a tolerance in the deviation between the pickup position by suction nozzle 80 and the supply position of bulk feeder 100 in the lengthwise direction of electronic component 150. Therefore, for cases in which the pickup position by suction nozzle 80 and the supply position of electronic component 150 from bulk feeder 100 deviate, just by adjusting the supply position in the widthwise direction of electronic component 150 using the flexibility of flexible section 200 of groove block member 172, as shown in FIG. 10, it is possible to align the pickup position by suction nozzle 80e and the supply position at the tip section of groove block member 172 (solid line) and perform suitable pickup of electronic component 150 by suction nozzle 80.

Also, the movement amount in the widthwise direction of moving section 202 of groove block member 172, in other words the correction amount of the supply position, is adjusted by controlling the amount of current passed through piezoelectric elements 180, and that amount of current to pass through those piezoelectric elements 180 is decided based on the image data from parts camera 96. In detail, with bulk feeder 100, before the supply position of an electronic component is corrected, the electronic component is picked up and held by suction nozzle 80, and an image of suction nozzle 80 holding the electronic component is captured by parts camera 96. Then, by processing that image data using image processing device 196, the deviation amount between suction nozzle 80 and the electronic component is calculated, and the amount of current to pass through piezoelectric elements 180 is decided based on that deviation amount. By this, it is possible to suitably align the pickup position by suction nozzle 80 and the supply position of the electronic component by bulk feeder 100. In addition, the calculation of the deviation amount between suction nozzle 80 and the electronic component, and the deciding of the amount of current to pass through piezoelectric elements 180, are performed for each suction nozzle 80, so that suitable pickup of electronic components 150 by all suction nozzles 80 can be performed.

Deviation amount calculating section (refer to FIG. 12) 210 as a functional section for calculating the deviation amount between suction nozzle 80 and an electronic component, and supply position correcting section (refer to FIG. 12) 212 as a functional means for correcting the supply position of an electronic component by deciding the amount of current to be passed through piezoelectric elements 180 based on that calculated deviation amount and sending that decided amount of current to piezoelectric elements 180, are provided on controller 192 of control device 190.

By the way, in the embodiment, bulk feeder 100 is an example of a bulk feeder and storage section 156, and groove 142 and groove 166 which comprise bulk feeder 100 are respectively an example of a storage section, and a supply passage. Also, moving section 202 of groove block member 172, curved section 168 of groove 166, and flexible section 200 of groove block member 172 are respectively an example of number one block section, number two block section, and a connecting section; and piezoelectric element 180 is an example of an actuator. Also, control device 190 is an example of a control device, and supply position correction section 212 which comprises control device 190 is an example of a supply position correction section. Also, mounting head 28 and moving device 30 are respectively an example of a mounting head and a moving device, and suction nozzle 80 of mounting head 28 is an example of a suction nozzle.

Further, the present invention is not limited to the above example embodiment, and various changed or improved methods of embodiment are possible based on the knowledge of someone skilled in the art. Specifically, for example, in the above embodiment, moving section 202 which functions as number one block section and flexible section 200 which functions as a connecting section are formed as one body, but it is acceptable for a number one block section and a connecting section to be two separate members, and for those two members to be connected. In this case, the member functions as a connecting section must have flexibility, but it is acceptable for the member functioning as the number one block section not to have flexibility.

Also, in the above embodiment, piezoelectric element 180 was used as an actuator to move the number one block section, but it is possible to use a variation of constructions. Specifically, examples such as an ultrasonic motor, electromagnetic motor, solenoid, hydraulic cylinder can be given.

Also, in the above embodiment, moving section 202 is moved in the widthwise direction of groove block member by arranging piezoelectric element 180 at both ends of moving section 202, but it is also acceptable to provide a mechanism for guiding moving section 202 in the widthwise direction of groove block member 172. Specifically, form a key groove extending in the widthwise direction of groove block member 172 along the base surface of straight section 170 arranged in groove block member 172, and form a key which can engage with that key groove in the lower surface of moving section 202. By this, it is possible to move moving section 202 accurately in the widthwise direction of groove block member 172.

SYMBOL DESCRIPTIONS

28: Mounting head; 30: Moving device; 80: Suction nozzle; 100: Bulk feeder; 142: Groove (supply passage); 156: Storage section; 166: Groove (supply passage); 168: Curved section (number two block section); 180: Piezoelectric element (actuator); 190: Control device; 200: Flexible section (connecting section); 202: Moving section (number one block section); 212: Supply position correction section

What is claimed is:

1. A bulk feeder, comprising:
    a storage section for storing multiple electronic components in a loose state;
    a supply passage for guiding the electronic components stored in the storage section to a supply position while arranged in a single line, the supply passage including a groove block member and the supply position as at a first end of the groove block member; and
    an actuator at the first end of the groove block member that adjusts the supply position while an electronic component of the multiple electronic components is supplied to the supply position,
    wherein the groove block member includes a flexible portion that extends from a second end of the groove block member to the actuator, the flexible portion bending in response to the actuator.

2. The bulk feeder according to claim 1 wherein the supply passage moves in the width direction with respect to the supply position by the operation of the actuator.

3. The bulk feeder according to claim 2 wherein the bulk feeder is equipped with a control device for controlling the operation of the actuator, wherein the control device has a supply position correction section for correcting the supply position by the movement of the actuator.

4. The bulk feeder according to claim 1 wherein the bulk feeder is equipped with a control device for controlling the operation of the actuator, wherein the control device has a supply position correction section for correcting the supply position by the movement of the actuator.

5. The bulk feeder according to claim 4 wherein the bulk feeder is fixedly connected to a mounting head which includes a suction nozzle for picking up and holding the electronic components supplied by the bulk feeder and moves together with the mounting head by a moving device.

6. The bulk feeder according to claim 5 wherein the mounting head has multiple suction nozzles and the supply position correction section corrects the supply position for each of the multiple suction nozzles.

7. The bulk feeder according to claim 5 wherein the supply position correction section corrects the supply position based on a deviation amount between the suction nozzle and the electronic component obtained by taking an image of the suction nozzle with the electronic component being held thereon.

8. The bulk feeder according to claim 7 wherein the mounting head has multiple suction nozzles and the supply position correction section corrects the supply position for each of the multiple suction nozzles.

9. The bulk feeder according to claim 1, wherein the groove block member includes a pair of side walls and the actuator contacts the pair of side walls to bend the pair of sidewalls at the flexible portion.

10. The bulk feeder according to claim 9, wherein the actuator includes at least one piezoelectric element that contacts each of the pair of sidewalls exterior to the supply position.

* * * * *